United States Patent [19]

Quadri

[11] 4,321,692
[45] Mar. 23, 1982

[54] BUBBLE MEMORY SYSTEM HAVING DEFECTIVE MINOR LOOPS

[75] Inventor: Farooq M. Quadri, San Jose, Calif.

[73] Assignee: National Semiconductor Corporation, Santa Clara, Calif.

[21] Appl. No.: 55,993

[22] Filed: Jul. 9, 1979

[51] Int. Cl.³ .............................................. G11C 19/08
[52] U.S. Cl. ........................................ 365/15; 365/83
[58] Field of Search .................... 365/15, 83, 219, 239, 365/240

[56] References Cited
U.S. PATENT DOCUMENTS 3,210,743 10/1965 Kaenel ................................. 365/239
4,092,728 5/1978 Baltzer ................................ 365/219

OTHER PUBLICATIONS

Electronics Design 1—"Very Long Shift Registers Can Be Built With RAMS", Jan. 4, 1977, p. 128.

Primary Examiner—James W. Moffitt
Attorney, Agent, or Firm—Brown & Martin

[57] ABSTRACT

Disclosed is a bubble memory system that includes a plurality of bubble memory chips. Each of the chips have a number of minor loops, but only a predetermined portion of the loops are utilized to store information therein. The remaining loops may be defective and are not used. Data words that are to be stored in the bubble memory chips are passed through a first FIFO circuit which scrambles the bits in the words prior to their storage in the bubble memory chips. Due to this scrambling operation, no bits are stored in the defective loops. Data bits that are received from the bubble memory chips are passed thorugh a second FIFO circuit. There, all of the bits of each word are then realigned and presented at the FIFO output in parallel.

9 Claims, 5 Drawing Figures

BUBBLE MEMORY SYSTEM HAVING DEFECTIVE MINOR LOOPS

BACKGROUND OF THE INVENTION

This invention relates to bubble memory systems that are comprised of multiple bubble memory chips each of which have some defective minor loops. Various architectures for bubble memory chips have been described in the prior art. Presently, one of the most popular designs includes a plurality of minor loops that are loaded in a serial-parallel fashion and are unloaded in a parallel-serial fashion. A bubble generator couples to the serial portion of the serial-parallel path and generates bubbles thereon. The generated bubbles propagate along serial protion of the path to align with respective minor loops. Then the bubbles are transferred to the parallel paths to each of the minor loops. Also a bubble detector connects to the serial portion of the parallel-serial path from the loops. Bubbles are first transferred in parallel to the serial portion of the path. Then they are serially propagated to the generator for detection.

It has been found desirable in the prior art to include extra or redundant minor loops on the chips. This is because, due to various fabrication deficiencies, a small percentage of the loops may become defective. Typically, this is about eight percent. By adding redundant loops, a predetermined portion of the total number of loops can be guaranteed to be non-defective. Thus, the redundant loops improve chip yield.

A problem however, with adding redundant loops on the memory chips is that some control circuitry is required for use in conjunction with the chips to insure that no information bits are loaded into or read from the defective loops. In other words, information words to be loaded into the memory must somehow be "scrambled" such that none of the bubbles on the serial portion of the serial-parallel path align with defective minor loops when the transfer of bubbles into the loops is made. The control circuitry must also somehow perform the inverse operation of "unscrambling" the signals from the bubble detector such that the original data words are reconstructed.

One way to perform this "scrambling" and "unscrambling" operation is to utilize a random access memory (RAM) as a buffer to the bubble memory. In a write operation, the data words are first written into the RAM. There, the words are modified or scrambled by inserting zeros between those bits of the words which would otherwise align with a defective minor loop in the bubble memory chips. Then the scrambled information is written into the bubble memory. Similarly, during a read operation, all of the signals from the bubble detectors are stored in the RAM. Then this information is unscrambled by first deleting those bits which came from defective minor loops. The remaining bits are then realigned to eliminate holes between the bits.

This apparatus however, has several undesirable features. For example, it requires the addition of considerable random access memory which is cost prohibitive. Also it requires substantial time to modify the data in the RAM before it is loaded into the bubble memory chips, and to modify the data in the RAM after it is read from the bubble memory chips. As a result, this system is both undesirably expensive and slow in operation.

Therefore, it is one object of the invention to provide an improved bubble memory system.

Still another object of the invention, is to provide a bubble memory system that utilizes an improved FIFO device to make defective minor loops transparent to the user.

SUMMARY OF THE INVENTION

These and other objectives are accomplished in accordance with the invention by a bubble memory system that includes a plurality of bubble memory chips, an improved FIFO circuit coupled to the input of the bubble memory chips, and a similar FIFO circuit coupled to the output of the bubble memory chips. Each of the bubble memory chips have a number of minor loops that are loaded in a serial-parallel fashion, and are unloaded in a parallel-serial fashion. Also, some of the minor loops are defective; and thus, only a predetermined portion of them are utilized to store bubbles.

The FIFO circuit coupled to the input of the bubble memory chips has a plurality of data inputs and a corresponding plurality of data outputs coupled to bubble generators on the bubble memory chips. It also has a clock input for loading all of the FIFO data inputs in parallel, and control inputs for unloading bits from selectable data outputs of the FIFO. Similarly, the other FIFO circuit has a plurality of data inputs coupled respectively to the bubble detectors on the bubble memory chips and a corresponding plurality of data outputs. It also has control inputs for loading bits from selectable ones of the bubble memory chips, and a clock input for removing bits from all of the FIFO data outputs in parallel.

Also in the preferred embodiment, the control inputs to both FIFO circuits are generated from a programmable logic array. The array is sequenced by an address counter. Each count in the counter corresponds to one loop in each bubble memory chip. And the programmable logic array generates outputs indicating which of these loops are defective.

BRIEF DESCRIPTION OF THE DRAWINGS

The preferred embodiments will best be understood when the Detailed Description is read in conjunction with the accompanying drawings wherein.

DETAILED DESCRIPTION

Figure 1:
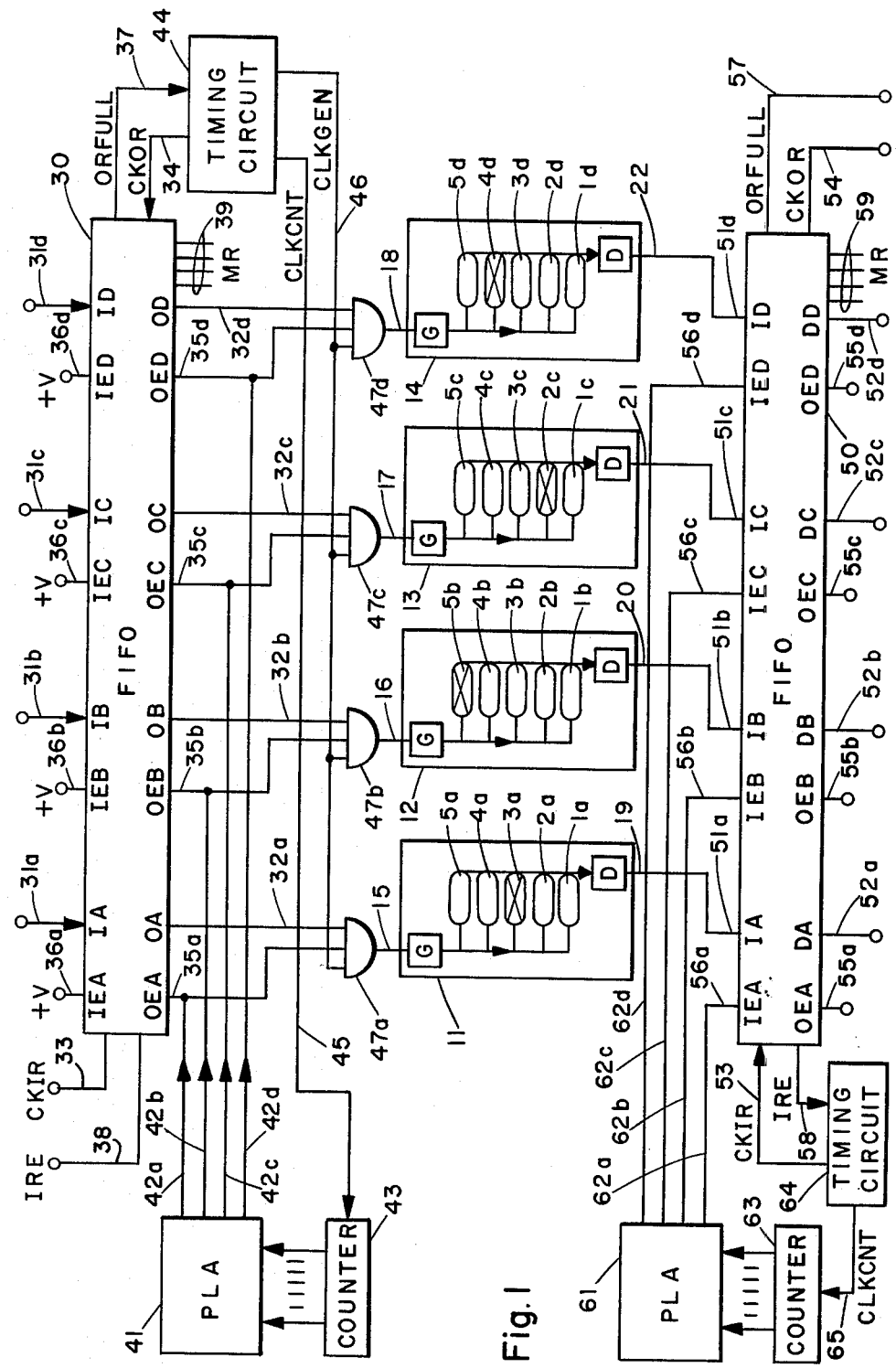
FIG. 1 is a circuit diagram of a bubble memory system constructed according to the invention.

A bubble memory system that is constructed according to the invention will now be described in conjunction with FIG. 1. This system includes bubble memory chips 11 through 14. It is to be understood however, that the system can be extended to include any number of additional bubble memory chips. They can be connected either in a parallel or serial fashion.

Each of the bubble memory chips include a plurality of minor loops for storing bubbles therein. In FIG. 1, the minor loops are indicated via reference numerals $1a$ through $5a$, $1b$ through $5b$, $1c$ through $5c$, and $1d$ through $5d$. Again, it is to be understood that the number of minor loops within each of the chips may be extended to some larger number. Suitably, each chip may include 280 minor loops for example.

Magnetic bubbles are stored in only a predetermined portion of the loops within each of the chips 11-14. In the FIG. 1 embodiment, bubbles are stored in only four of the loops. Accordingly, the remaining loops may be either operable or defective. They are indicated with an "x" in FIG. 1. Again, it is to be understood that the number of loops that are guaranteed to be non-defective can be modified. For example, if each chip has a total of 280 loops, then suitably, 264 of them may be guaranteed non-defective.

Bubbles are transferred into the minor loops of chips 11 through 14 in a serial-parallel fashion. To accomplish this, each chip includes a serial-parallel bubble propagation path. Bubbles are generated on the serial portion of the serial-parallel propagation paths by bubble generators which are indicated via the letter G in FIG. 1. These generators produce bubbles in response to signals applied to leads 15 through 18 respectively.

Similarly, bubbles are read from the loops in a parallel-serial fashion. To accomplish this, each chip includes a parallel-serial bubble propagation path from the loops.

Bubbles on the serial portion of the parallel-serial path are detected by bubble detectors that are indicated via the letter D in FIG. 1. The output from the detectors in chips 11 through 14 occurs on leads 19 through 22 respectively.

The remaining portion of the FIG. 1 memory system includes apparatus for selectively generating bubbles via the generators G and for selectively storing bubbles that are detected by the detectors D. These operations are performed such that no information is written into or stored from the defective minor loops. That portion of the apparatus which operates to generate the bubbles will now be described in detail.

It includes a new type of first-in-first-out device (FIFO) 30. FIFO 30 has four data inputs 31a through 31d, and four data outputs 32a through 32d. Information bits on leads 31a through 31d are loaded in parallel into FIFO 30 by applying a Clock Input Register Signal (CKIR) to a clock lead 33. These information bits are selectively removed from the FIFO on leads 32a through 32d by applying a Clock Output Register Signal (CKOR) to a clock lead 34 while selectively applying a high voltage level to output enable leads 35a through 35d. A low voltage level on any one of the output enable leads 35a through 35d operates to inhibit the removal of bits from the corresponding data output leads 32a through 32d.

In the preferred embodiment of FIG. 1, chip 30 also has four input enable leads 36a through 36d. They enable data bits on leads 31a through 31d to be selectively loaded into the FIFO. For example, a high voltage on lead 36a in conjunction with signal CKIR on lead 33 loads the data bit on lead 31a into the FIFO. This selective loading capability is not required or utilized to selectively generate bubbles via the generators G. However, it is utilized to selectively store bits from the detectors D. And by providing both selective loading and selective unloading capability on one FIFO chip, the same chip type can be used for both the bubble generate control logic and the bubble detect control logic.

Finally, chip 30 also provides an Output Register Full Signal (ORFULL) on a lead 37, an Input Register Empty Signal (IRE) on a lead 38, and a Master Reset, (MR) and supply voltage inputs on leads 39. Signal ORFULL is high whenever each of the data output leads 32a through 32d have an information bit present thereon. Signal IRE is high whenever at least one more bit on leads 31a through 31d can be stored in the FIFO. And the MR input provides a means to initialize the chip to be a predetermined state.

A programmable logic array (PLA) 41 in included in the disclosed memory system to generate the output enable signals for chip 30. PLA 41 has outputs 42a through 42d which respectively provide the output enable signals on leads 35a through 35d. The PLA is sequenced by means of a counter 43. This counter has a number of states equal to the number of minor loops in each of the bubble memory chips 11 through 14. Also, PLA 41 is programmed such that the output signals on leads 42a through 42d are selectively low whenever counter 43 addresses a defective minor loop. For example, when counter 43 contains a binary two, the signal on lead 42c is low; and when counter 43 contains a binary three, the signal on lead 42a is low.

All of the above described apparatus are synchronized by signals from a timing circuit 44. First, circuit 44 generates a signal CLKCNT on a lead 45 which clocks counter 43. Then after counter 43 has counted and PLA 41 has generated appropriate output signals on leads 42a through 42d, timing circuit 44 generates another signal CLKGEN on a lead 46. That signal selectively clocks the bubble generators in chips 11 through 14. The selective clocking is achieved by feeding signal CLKGEN to AND gates 47a through 47d which in turn have outputs connected respectively to the bubble generators in chips 11 through 14. Gates 47a through 47d also respectively receive the enabling signals on leads 42a through 42d and the data output signals on leads 32a through 32d.

Subsequent to the generation of signal CLKGEN, circuit 44 generates signal CKOR on lead 34. This signal in combination with the enabling signals on leads 42a through 42d selectively removes data bits from chip 30. Then circuit 44, monitors the ORFULL signal on lead 37. That signal must indicate that one more bit may be taken from each of the data output leads 32a through 32d before the above described timing sequence is repeated.

That portion of FIG. 1 which remains to be described operates to selectively store signals from the bubble detectors on chips 11 through 14. This circuitry includes a FIFO chip 50, a PLA 61, a counter 63, and a timing circuit 64. Chip 50 is identical to the above described chip 30. Reference numerals 51a through 59 compare respectively to reference numerals 31a through 39.

PLA 61 is provided to generate the input enable signals for chip 50. Specifically, the input enable signals on leads 56a through 56d are respectively provided by outputs 62a through 62d of PLA 61. Also, counter 63 is provided to sequence PLA 61. And timing circuit 64 is provided to synchronize the operation of FIFO 50, PLA 61, and counter 63.

Basically, circuit 64 first generates a signal CLKCNT on lead 65 to clock counter 63. Subsequently, circuit 64 generates a signal CLKIR on lead 53 to selectively load data into chip 50. Then, circuit 64 monitors signal IRE on lead 58 to determine if chip 50 has room for more data bits to be stored therein. If it does, the timing cycle is repeated.

Figure 2:
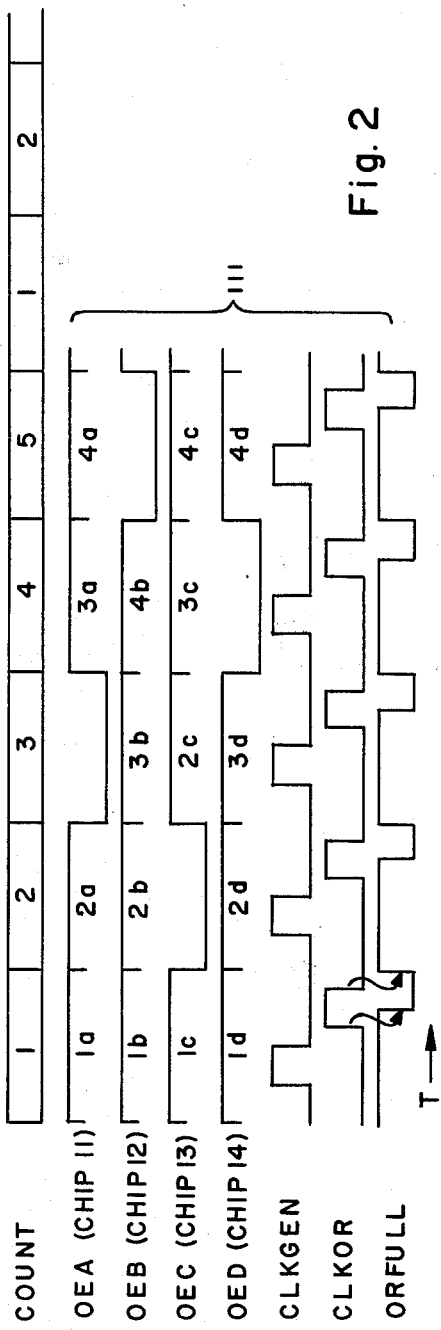
FIG. 2 is a timing diagram illustrating the loading of information into the bubble memory system of FIG. 1.
Figure 3:
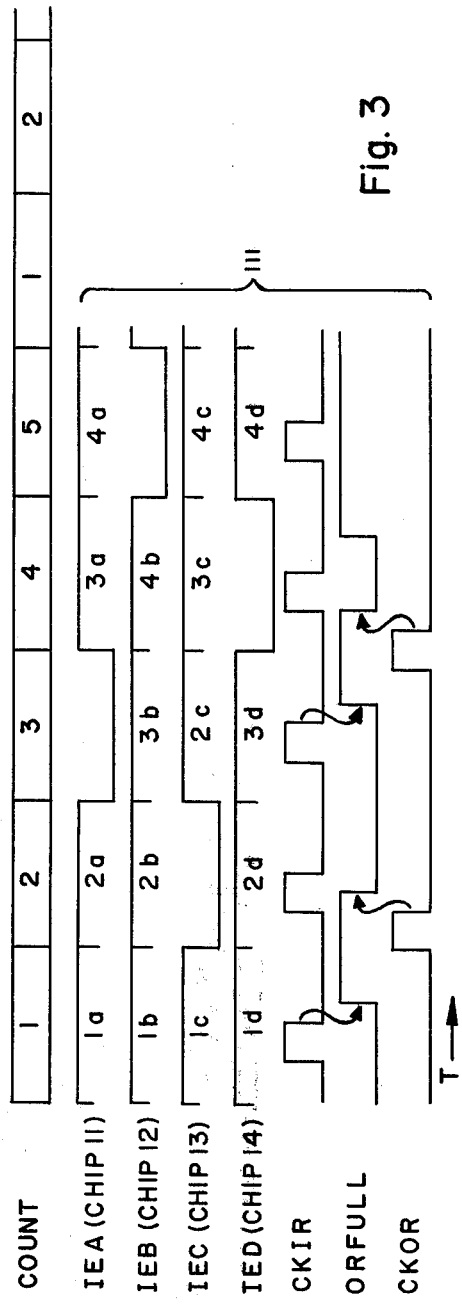
FIG. 3 is a timing diagram illustrating the unloading of information from the bubble memory system of FIG. 1.

Timing diagrams of the above described sequences are illustrated in FIGS. 2 and 3. Referring first to FIG.

2, it can be seen that when counter 43 has a count of one in it, all of the outputs of chip 30 are enabled. In comparison, when counter 43 has a count of two in it, output enable C is disabled. This is because the second minor loop in chip 13 is defective. For similar reasons, the output enable signals for chips 11, 14, and 12, respectively are forced low when counter 43 has counts of three, four, and five.

FIG. 2 also clearly illustrates how the four data words that are unloaded from FIFO 30 are "scrambled" within the bubble memory chips 11 through 14. The second word for example, is split among the second minor loops of chips 11, 12 and 14 and the third minor loops of chip 13. Also the third word is split among the third minor loop at chips 12 and 14, and the fourth minor loop of chips 11 and 13.

A timing diagram illustrating the "unscrambling" of these data words is included herein as FIG. 3. There, the input enable signals for chips 11 through 14 are respectively forced low when counter 63 has a count of three, five, two, and four. As a result, signals from the defective minor loops in chips 11 through 14 are not stored in FIFO 50. Then by the operation of the FIFO circuitry, all of the bits within the respective words are realigned at the data output leads 52a through 52d.

Figure 4:
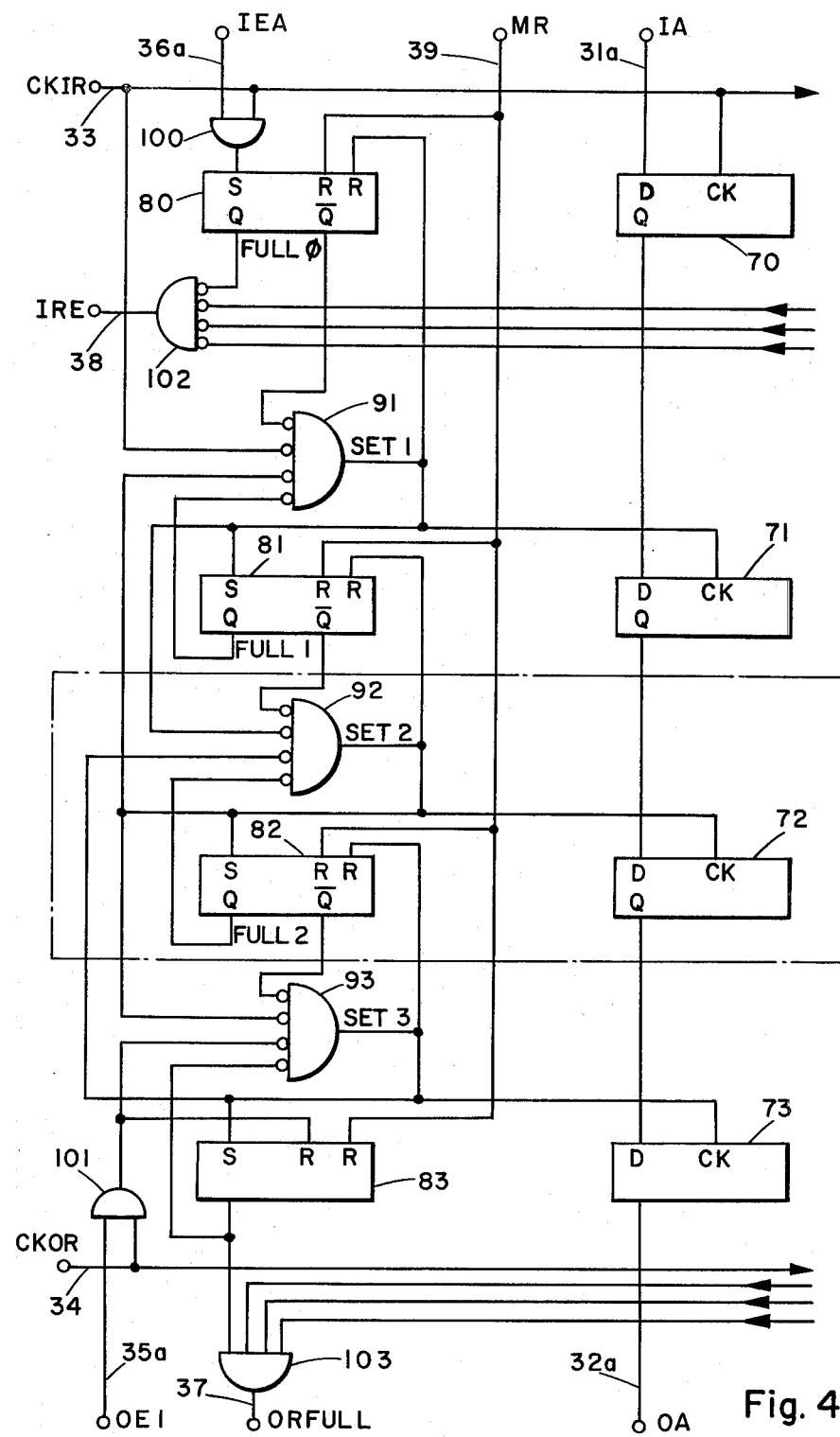
FIG. 4 is a logic diagram of a portion of the FIFO chips in the bubble memory system of FIG. 1.

FIFO chips 30 and 50 will now be described in greater detail in conjunction with FIG. 4. That figure is a logic diagram of the circuitry associated with only one data input and data output. To obtain a logic diagram of the entire FIFO chip, the circuitry illustrated in FIG. 4 is repeated four times. Reference numerals 31a, 32a, 35a, and 36a are assigned in FIG. 4 to make the logic of that figure correlate to the first input of chip 30 in FIG. 1 as an example.

Data bits that are received on data input lead 31a are initially stored in a triggerable D flip-flop 70. Subsequently, these data bits are propagated through flip-flops 71, 72, and 73 to output data lead 32a. This propagation occurs under control of signals that are stored in set-reset flip-flops 80 through 83, and which are logically combined via NOR gates 91 through 93. The output of NOR gates 91 through 93 respectively generate logic signals SET1, SET2, SET3. These in turn respectively operate to clock data bits into flip-flops 71 through 73. The actual sequence by which this occurs will be described shortly in conjunction with FIG. 5.

The circuitry of FIG. 4 also includes a pair of logical AND gates 100 and 101. Gate 100 operates to set flip-flop 80 only under the coincidence of signals on leads 33 and 36a. Also, the set state of flip-flop 80 indicates when flip-flop 70 has data stored therein. Thus, gate 100 provides a means for selectively loading data bits into the FIFO. Similarly, AND gate 101 operates to reset flip-flop 83 only upon the coincidence of signals on leads 34 and 35a. Further, the set state of flip-flop 83 indicates when data bits are present in flip-flop 73. Thus, AND gate 100 provides a means for selectively removing data bits from the FIFO.

The FIG. 4 circuitry further includes a pair of NOR gates 102 and 103. Gate 102 has inputs from each of the flip-flops 80. Thus, the output of NOR gate 102 is high only if each of the flip-flops 80 indicate that no data is stored in the corresponding flip-flop 70. In comparison, AND gate 103 has inputs from each of the flip-flops 83. Thus, the output of gate 103 will be high only when each of the flip-flops 83 is set. This condition occurs only when the flip-flops 73 have data stored therein.

Figure 5:
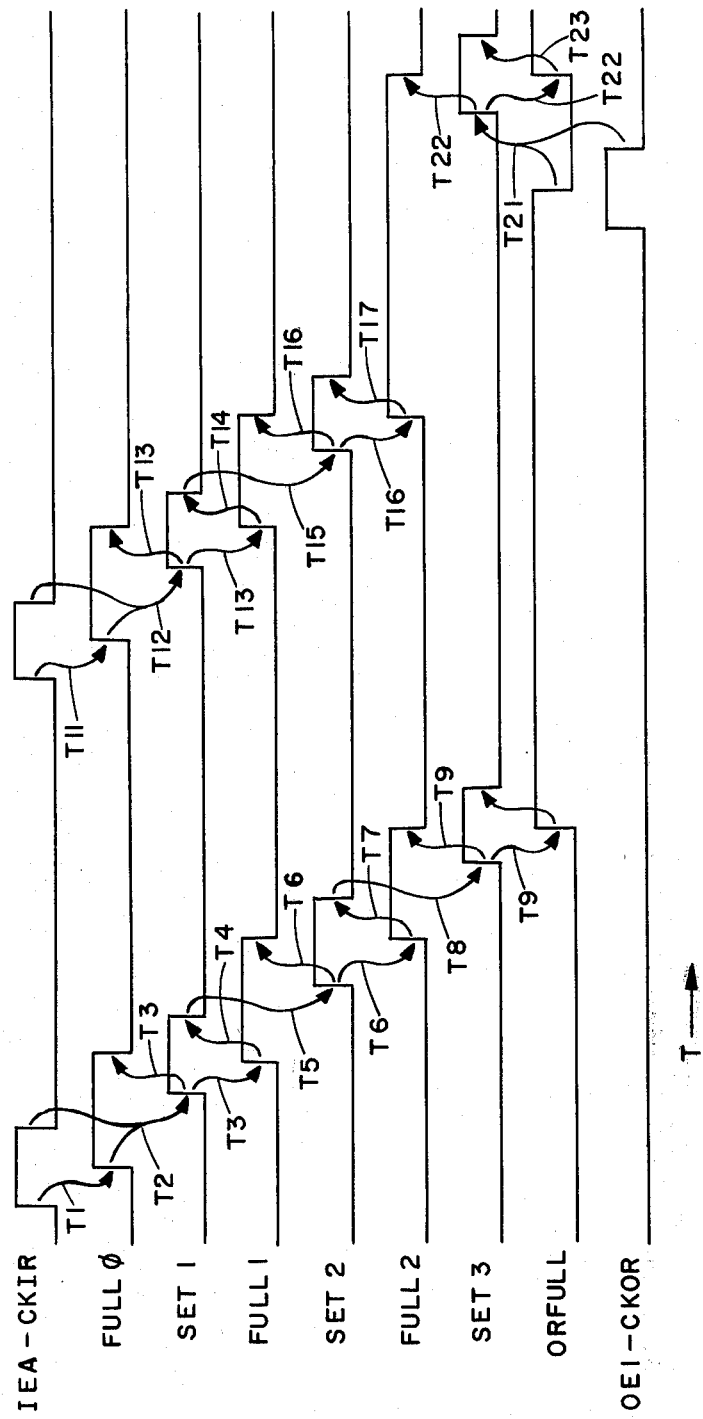
FIG. 5 is a timing diagram illustrating the operation of the FIFO of FIG. 4.

Referring now to FIG. 5, the sequence in which data is propagated from flip-flop 70 to flip-flop 73 will be described. First, the coincidence of signals IEA on lead 36a and CKIR on lead 33 occurs. In response as indicated by transition T1, flip-flop 80 sets. Then in response to flip-flop 80 being sent and the removal of signal CKIR, gate 91 generates signal SET1. This is indicated by the transition T2. Signal SET1 in turn, operates to reset flip-flop 80, to clock information from flip-flop 70 to flip-flop 71, and to set flip-flop 81. This is indicated by transition T3.

The set output of flip-flop 81 feeds back to one of the inputs of gate 91. As a result, the output of gate 91 goes low in response to flip-flop 81 being set. This is indicated by transition T4. Then the concurrence of signal SET1 being low in combination with flip-flop 81 being set causes gate 92 to generate signal SET2. This is indicated via transition T5.

Signal SET2 operates to reset flip-flop 81, to transfer data from flip-flop 71 to flip-flop 72, and to set flip-flop 82. This is indicated via transition T6. Then, the set state of flip-flop 82 feeds back to NOR gate 92 to force signal SET2 to a low state. This is indicated via transition T7.

The low state of signal SET2 in combination with flip-flop 82 being set causes NOR gate 93 to generate signal SET3. This is indicated by transition T8. Signal SET3 in turn, operates to reset flip-flop 82, to transfer information from flip-flop 72 to flip-flop 73, and to set flip-flop 83. This is indicated via transition T9.

The output of AND gate 103 indicates when all of the flip-flops 83 are set. Anytime thereafter, signal CKOR on lead 34 may be generated to remove data from the FIFO. Simultaneously of course, other information may also be loaded into the FIFO as indicated by the transitions T11 through T17.

Information is removed from flip-flop 73 as indicated via transitions T21 through T23. To begin, the coincidence of signals CKOR on lead 34 and OE1 on lead 35a resets flip-flop 83. The reset state of flip-flop 83 in combination with a low state from AND gate 101 (which occurs after clock signals CKOR is removed) operates to generate signal SET3. This is indicated by transition T21. Signals SET3 in turn operates to transfer data from flip-flop 72 to flip-flop 73, to reset flip-flop 82, and to set flip-flop 83. This is indicated via transition T22. Then, the set state of flip-flop 83 feeds back to NOR gate 93 to remove signal SET3. The new information that is stored in flip-flop 73 is now ready to be removed in a manner as described above.

A preferred embodiment of the invention has now been described in detail. In addition, however, many changes and modifications can be made to these details without departing from the nature and spirit of the invention. For example, the number of bubble memory chips in the memory system can be expanded, the number of minor loops in each of the memory chips can be increased, and the number of data storage flip-flops and corresponding control flip-flops within the FIFO can be increased. Thus, it is to be understood that the invention is not limited to said details, but is defined by the appended claims.

I claim:
1. A bubble memory system comprised of:
 a plurality of bubble memory chips; each of said chips having a number of minor loops, at least a predetermined portion of said loops being non-defective, and means for transferring bubbles in parallel from all of said loops onto a serial propagation path to a bubble detection means; and FIFO means having a plurality of data inputs coupled to respective outputs on said bubble detection means of each bubble memory chips, a corresponding plurality of data outputs, control inputs for selectively loading bits on said data inputs into said FIFO, and a clock input for removing bits from all of said data outputs in parallel.

2. A bubble memory system according to claim 1 wherein said FIFO means is comprised of a plurality of FIFO chips; each of said FIFO chips having multiple data inputs, a corresponding number of data outputs, control leads for loading bits on selectable ones of said data inputs into said FIFO chips, and a clock lead for unloading bits from all of said data outputs in parallel.

3. A bubble memory system according to claim 1 and further including control means coupled to said control inputs on said FIFO means for loading bits into said FIFO means from only said predetermined portion of non-defective loops in each of said bubble memory chips.

4. A bubble memory system according to claim 3 wherein said control means includes a counter coupled to the address inputs of a programmable logic array having outputs coupled to said control inputs of said FIFO means.

5. A bubble memory system comprised of:
a plurality of bubble memory chips; each of said chips having a number of minor loops, at least a predetermined portion of said loops being non-defective, and means for generating bubbles on a serial propagation path and for transferring bubbles in parallel therefrom into all of said loops; and FIFO means having a plurality of data inputs, a corresponding plurality of data inputs respectively coupled to said means for generating bubbles on said chips, a clock input for loading bits on all of said data inputs in parallel into said FIFO, and control inputs for unloading bits at selectable ones of said data outputs from said FIFO.

6. A bubble memory system according to claim 5 wherein said FIFO means is comprised of a plurality of FIFO chips; each of said FIFO chips having multiple data inputs, a corresponding plurality of data outputs, a clock lead for loading bits on all of said data inputs in parallel, and control leads for unloading bits from selectable ones of said data outputs.

7. A bubble memory system according to claim 5 and further including control means coupled to said control inputs for unloading bits from said FIFO means to only said predetermined portion of non-defective loops in each of said bubble memory chips.

8. A bubble memory system according to claim 7 wherein said control means includes a counter coupled to the address inputs of a programmable logic array having inputs coupled to said control inputs of said FIFO means.

9. A bubble memory system comprised of:
a plurality of bubble memory chips; each of said chips having a number of minor loops, at least a predetermined portion of said loops being non-defective, means for loading all of said loops in a serial parallel manner, and means for unloading all of said loops in a parallel serial manner;

first FIFO means having a plurality of data inputs, a corresponding plurality of data outputs respectively coupled to data inputs on said chips, a clock input for loading bits on all of said first FIFO data inputs in parallel, and control inputs for unloading bits from selectable ones of said first FIFO data outputs; and second FIFO means having a plurality of data inputs coupled to respective outputs on said bubble memory chips, a corresponding plurality of data outputs, control inputs for loading bits from selectable ones of said second FIFO data inputs, and a clock input for removing bits from all of said second FIFO data outputs is parallel.

* * * * *